(12) United States Patent
Miura et al.

(10) Patent No.: US 6,596,590 B1
(45) Date of Patent: Jul. 22, 2003

(54) METHOD OF MAKING MULTI-LEVEL TYPE NON-VOLATILE SEMICONDUCTOR MEMORY DEVICE

(75) Inventors: Hirotomo Miura, Tokyo (JP); Yasuo Sato, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 145 days.

(21) Appl. No.: 09/679,649

(22) Filed: Oct. 5, 2000

Related U.S. Application Data

(62) Division of application No. 09/053,492, filed on Apr. 2, 1998, now abandoned.

(30) Foreign Application Priority Data

Apr. 25, 1997 (JP) .............................................. 9-123058

(51) Int. Cl.[7] ......................................... H01L 21/8247
(52) U.S. Cl. ...................... 438/261; 438/287; 438/591
(58) Field of Search ................................. 438/216, 259, 438/261, 287, 288, 591, 954

(56) References Cited

U.S. PATENT DOCUMENTS

| | | | |
|---|---|---|---|
| 4,458,407 A | * 7/1984 | Hoeg et al. ................. | 438/261 |
| 5,278,440 A | 1/1994 | Shimoji ...................... | 257/324 |
| 5,319,229 A | * 6/1994 | Shimoji et al. ............. | 438/287 |
| 5,555,204 A | 9/1996 | Endoh et al. .......... | 365/189.01 |
| 5,576,564 A | 11/1996 | Satoh et al. ................ | 257/295 |
| 5,644,528 A | 7/1997 | Kojima .................. | 365/185.03 |
| 5,739,569 A | 4/1998 | Chen ........................... | 257/321 |
| 6,060,723 A | 5/2000 | Nakazato et al. ............. | 257/20 |
| 6,133,603 A | 10/2000 | Nomoto ....................... | 257/315 |
| 6,218,700 B1 | * 4/2001 | Papadas ...................... | 257/324 |

FOREIGN PATENT DOCUMENTS

| | | |
|---|---|---|
| JP | 62-040774 | 2/1987 |
| JP | 5-55596 A | 3/1993 |
| JP | 5-315622 | 11/1993 |
| JP | 6-13628 A | 1/1994 |
| JP | 7-169865 A | 7/1995 |
| JP | 7-273227 A | 10/1995 |
| JP | 8-83855 A | 3/1996 |
| JP | 8-153810 | 6/1996 |
| JP | 8-153812 | 6/1996 |
| JP | 8-235886 A | 9/1996 |
| JP | 9-74146 A | 3/1997 |

* cited by examiner

Primary Examiner—Chandra Chaudhari
(74) Attorney, Agent, or Firm—Connolly Bove Lodge & Hutz, LLP; Larry J. Hume

(57) ABSTRACT

A nonvolatile semiconductor memory device having nonvolatile memory cells, each of said memory cells including a semiconductor substrate of one type of electric conduction, a pair of source and drain regions of the opposite type of electric conduction formed in the semiconductor substrate, an electric charge-capturing film formed on a channel region between the pair of source and drain regions, and a gate electrode formed on the charge-capturing film and working as a control electrode. The electric charge-capturing film has a multi-layer structure in which at least four insulating films and at least three dielectric films each working as an electric charge accumulation layer are alternatingly laminated one upon the other, the lowermost insulating film among the at least four insulating films is formed as a gate-insulating film, a plurality of different threshold voltages are set to the at least three dielectric films to correspond to their electric charge-capturing states, and at least four kinds of memory states are specified depending upon the plurality of threshold voltages. This constitution makes it possible to easily and reliably adjust the amount of electric charge to be captured and, hence, to store desired multi-value data while preventing the occurrence of an inconvenience such as data corruption.

12 Claims, 10 Drawing Sheets

METHOD OF MAKING MULTI-LEVEL TYPE NON-VOLATILE SEMICONDUCTOR MEMORY DEVICE

CROSS-REFERENCE TO RELATED APPLICATIONS

This application is a divisional of U.S. patent application Ser. No. 09/053,492 now abandoned filed Apr. 2, 1998.

BACKGROUND OF THE INVENTION

1. Field of the Invention

The present invention relates to a nonvolatile semiconductor memory device and, more particularly, to a multi-level type nonvolatile semiconductor memory device for storing data of not smaller than 2 bits (=4 values) in a memory cell.

2. Description of the Related Art

Accompanying an increase in the number of functions of various portable electronic devices and home appliances, an increasing importance has been placed on the technology for integrating a logic LSI as represented by a one-chip microcomputer with a nonvolatile semiconductor memory device which maintains the data stored even when a connection to the power supply is broken.

In general, nonvolatile semiconductor memories can be represented by an EEPROM (electrically erasable and programmable read only memory) that can electrically rewrite and erase data and a flash memory that can electrically erase data at one time. Both the EEPROM and the flash memory use basically the same MOS-type memory cell structure. That is, they have a structure in which an electrically insulated floating gate is formed on a gate-insulating film (generally, an oxide film) formed on a channel region between a pair of impurity-diffused regions (source and drain) formed in a semiconductor substrate, and a control gate (gate electrode) is provided thereon via an insulating film. In such nonvolatile memories of the MOS type, a predetermined voltage is applied to the control gate to apply an intense electric field relative to the channel region, so that the floating gate captures an electric charge so as to be electrically charged into a predetermined type of conduction thereby to store the data. When the electric charge in the floating gate is removed, the initial state is resumed and the data is erased.

A polysilicon film is typically used as a floating gate, but it has been known that the same effect can also be obtained even by using a silicon nitride film instead of the polysilicon film. That is, the device can be electrically charged into a predetermined type of conduction (in other words, data is stored) by causing the electric charge captured at the capturing center (trap) to exit in the interface between the gate oxide film and the silicon nitride film formed on the gate oxide film. A nonvolatile memory of the MNOS (metal-nitride-oxide semiconductor) type is one obtained by forming a control gate electrode on the silicon nitride film.

In the MNOS-type nonvolatile memory, however, the silicon nitride film for capturing the electric charge is in contact with the control gate electrode and causes a problem in that the electric charge accumulated in the silicon nitride film can easily leak. In order to cope with this problem, there was devised a nonvolatile memory of the MONOS (metal-oxide-nitride-oxide semiconductor) type obtained by forming an insulating film (generally, an oxide film) between the silicon nitride film and the control gate electrode.

Owing to the technology for integration, in recent years, there have been developed transistors having a gate electrode measuring not larger than 1 $\mu$m. In the EEPROM, too, floating gates and control gates can be formed in fine sizes. At present, however, the technology has been accompanied by a limit of from 0.35 $\mu$m to 0.5 $\mu$m from the standpoint of mass production.

As another form of increasing the degree of integration, furthermore, a multi-level type nonvolatile semiconductor memory (multi-value memory) has been developed, which is so constituted that an increased amount of data is stored in a memory cell instead of finely forming the elements. In the multi-value memory, the amount of electric charge accumulated in the floating gate is adjusted in order to control the threshold value of the memory depending upon the data that are to be stored. In a heretofore known binary memory (in which each memory cell stores data of "1" or "0"), when, for example, an electric charge is accumulated in the floating gate, the threshold value of the memory cell becomes not smaller than 4 V, and no drain current flows when a voltage of 3 V is applied to the control gate, a voltage of 5 V is applied to the drain region and a voltage of 0 V is applied to the source region. When no electric charge is accumulated in the floating gate, however, the threshold value of the memory cell becomes not larger than 1 V and a drain current flows. In a multi-value memory, for example, in the case of a quaternary memory, the data is stored by controlling the threshold voltage of the memory cell to be 0.5 V, 1.5 V, 2.5 V and 3.5 V. The multi-value memories include those of the floating gate type, MNOS type, MONOS type and the like.

However, a limitation is imposed on increasing the values; i.e., the reliability decreases if data are stored in too large amounts in a memory cell.

To increase the values by using the above-mentioned MONOS-type nonvolatile memory, furthermore, a voltage applied to the gate electrode is suitably changed to adjust the amount of electric charge captured by the silicon nitride film to thereby realize memory states of many stages depending upon the amount of electric charge that is captured.

As the thickness of the film (silicon nitride film in this case) for capturing electric charge decreases, however, the amount of electric charge that is captured undergoes a large change, and depends upon a slight change in the voltage applied to the gate electrode, making it very difficult to adjust the amount of electric charge that is captured. Moreover, the stored data is detected through a slight difference in the amount of electric charge that is captured and, hence, even a slight leakage of charge from the trap gives rise to the occurrence of data corruption.

As prior art that has heretofore been known, furthermore, Japanese Unexamined Patent Publication (Kokai) No. 5-55596 discloses a MONOS-type nonvolatile memory equipped with many laminated films obtained by alternatingly forming silicon oxide films and silicon nitride films one upon the other to capture the electric charge. This nonvolatile memory is able to maintain reliability for extended periods of time by enhancing its performance for holding electric charge. However, the art disclosed here does not teach storing data on many levels.

As another prior art, Japanese Unexamined Patent Publication (Kokai) No. 9-74146 discloses a nonvolatile memory of the MONOS structure having a silicon nitride film sandwiched between two silicon oxide films to accumulate the electric charge between the control gate and the semiconductor substrate. In this nonvolatile memory, a voltage applied to the control gate is changed to adjust the amount of electric charge accumulated in the silicon nitride film thereby to store multi-value data depending upon the amount of electric charge that is accumulated. However, the memory cell disclosed here has only one silicon nitride film that works to accumulate the electric charge. It is therefore likely that the amount of electric charge accumulated in the silicon nitride film undergoes a change to a large extent, making it difficult to adjust the amount of electric charge that is accumulated.

As a further prior art, Japanese Unexamined Patent Publication (Kokai) No. 8-235886 discloses technology for storing data of three or more values in a memory cell having a charge-accumulating layer in a nonvolatile memory of the floating gate-type or the MNOS-type. Even in the technology disclosed here, however, there is provided only one floating gate layer or a silicon nitride film for accumulating the electric charge, from which it is considered that it will be difficult to adjust the amount of electric charge that is accumulated causing a fluctuation in the accumulated amount of electric charge as described above.

As a still further prior art, Japanese Unexamined Patent Publication (Kokai) No. 7-273227 discloses a nonvolatile memory of a structure equipped with two floating gate layers to accumulate electric charge between the control gate and the channel region. In the nonvolatile memory disclosed here, the amount of electric charge stored in the two floating gate layers is adjusted to store multi-value data, and the threshold voltage of the memory cell is so controlled as to change by a predetermined value for every increase in the value. In the nonvolatile memory of the floating gate type, a preset threshold voltage decreases due to a leakage of the accumulated electric charge giving rise to the occurrence of data corruption as in the nonvolatile memories of the MNOS type and MONOS type. When the threshold voltage is high, in particular, the amount of drop increases due to the leakage of charge causing the data to be corrupted more frequently. In the art disclosed here, the threshold voltage changes by a predetermined value every time the value increases by one. When the threshold voltage is high, in particular, it is more likely that the data will be corrupted.

As a yet further prior art, Japanese Unexamined Patent Publication (Kokai) No. 8-83855 discloses a nonvolatile memory equipped with two floating gate layers that work to accumulate the electric charge as in the above-mentioned Japanese Unexamined Patent Publication (Kokai) No. 7-273227. The art disclosed here involves the same problems as those described above.

As a further prior art, Japanese Unexamined Patent Publication (Kokai) No. 6-13628 discloses a semiconductor memory of the MNOS type or the MONOS-type. This semiconductor memory has been highly integrated in order to increase the yield of production. However, the art disclosed here does not at all teach storing the data on multi-levels. Besides, since there is provided only one silicon nitride film for accumulating the electric charge, it will be difficult to adjust the amount of electric charge causing a fluctuation in the accumulated amount of electric charge as described above.

As another prior art, Japanese Unexamined Patent Publication (Kokai) No. 7-169865 discloses a nonvolatile memory having a structure in which a floating gate is formed on the side surface of a protruded portion or a recessed portion on a semiconductor substrate to work as a layer for accumulating the electric charge, and a control gate is provided covering the floating gate as in the above-mentioned Japanese Unexamined Patent Publication (Kokai) No. 6-13628. It is, however, considered that the technology disclosed here involves the same problems as those described above.

SUMMARY OF THE INVENTION

A principal object of the present invention is to provide a nonvolatile semiconductor memory device capable of storing desired multi-value data by easily and reliably adjusting the amount of electric charge that is captured while preventing the occurrence of inconveniences such as data corruption.

Another object of the present invention is to provide a nonvolatile semiconductor memory device which makes it possible to further decrease the memory cell area and to simplify the steps of production.

A further object of the present invention is to provide a method of producing the above-mentioned nonvolatile semiconductor memory device and a method of writing/reading data using the above-mentioned device.

In order to accomplish the above-mentioned objects according to one aspect of the present invention, there is provided a nonvolatile semiconductor memory device having nonvolatile memory cells, each of said memory cells comprising a semiconductor substrate of one type of electric conduction, a pair of source and drain regions of the opposite type of electric conduction formed in said semiconductor substrate, an electric charge-capturing film formed on a channel region between said pair of source and drain regions, and a gate electrode formed on said charge-capturing film and working as a control electrode, wherein said electric charge-capturing film has a multi-layer structure in which at least four insulating films and at least three dielectric films each working as an electric charge accumulation layer are alternatingly laminated one upon the other, the lowermost insulating film among said at least four insulating films is formed as a gate-insulating film, a plurality of different threshold voltages are set to said at least three dielectric films to correspond to their electric charge-capturing states, and at least four kinds of memory states are specified depending upon said plurality of threshold voltages.

According to another aspect of the present invention, there is provided a method of producing nonvolatile semiconductor memory devices, comprising: a step of forming a multi-layer film by successively depositing a first insulating film, a first dielectric film working as an electric charge accumulation layer, a second insulating film, a second dielectric film working as an electric charge accumulation layer, a third insulating film, a third dielectric film working as an electric charge accumulation layer, and a fourth insulating film on a predetermined region on a semiconductor substrate; a step of forming an electrically conducting layer on said multi-layer film and forming a resist thereon in a shape that meets the shape of a gate electrode; a step of forming an electric charge-capturing film and a gate electrode in the shape of said resist by removing said multi-layer film and said electrically conducting layer by using said resist as a mask; and a step of forming a source region and a drain region by adding impurities having a type of electric conduction opposite to that of said semiconductor substrate to a surface region of said semiconductor substrate by using said resist as a mask.

According to a further aspect of the present invention, there is further provided a method of producing nonvolatile semiconductor memory devices, comprising: a step of forming a trench in a recessed shape at a predetermined position on a semiconductor substrate; a step of forming a multi-layer film by successively depositing a first insulating film, a first dielectric film working as an electric charge accumulation layer, a second insulating film, a second dielectric film working as an electric charge accumulation layer, a third insulating film, a third dielectric film working as an electric charge accumulation layer, and a fourth insulating film so as to cover the whole surface of said semiconductor substrate; a step of forming an electrically conducting layer so as to cover said multi-layer film; a step of forming an electric charge-capturing film of an L-shape and a gate electrode so as to span over a side wall of said trench and a portion of the bottom in contact with said side wall by subjecting the whole region where said electrically conducting layer is formed to an isotropic dry etching; and a step of forming a source region and a drain region by adding impurities having a type of electric conduction opposite to that of said semiconductor substrate to the surface region of said semiconductor substrate by masking only the region of said gate electrode.

In a preferred embodiment of the invention, said source region is formed relative to said gate electrode via said electric charge-capturing film on a region on the bottom of said trench other than the region where said gate electrode is formed, and said drain region is formed relative to said gate electrode via said electric charge-capturing film on a region on said semiconductor substrate other than the region where said trench is formed. Also, the step for forming said multi-layer film includes steps for forming oxide films as said first to fourth insulating films, and steps for forming nitride films as said first to third dielectric films. Also, at least said second to fourth oxide films are formed maintaining the same thickness, and said first to third nitride films are formed maintaining the same thickness. Furthermore, said first to third nitride films are formed maintaining a thickness larger than that of said second to fourth oxide films.

In another preferred embodiment of the invention, said second to fourth oxide films are formed maintaining thicknesses that successively increase from the lower layer toward the upper layer. Also, said first to third nitride films are formed maintaining thicknesses that successively increase from the lower layer toward the upper layer.

In a still another preferred embodiment of the invention, the step for forming said multi-layer film includes steps for forming oxide films as said first to fourth insulating films, and steps for forming polysilicon films as said first to third dielectric films. Also, at least said second to fourth oxide films are formed maintaining the same thickness, and said first to third polysilicon films are formed maintaining the same thickness. Furthermore, said first to third polysilicon films are formed maintaining a thickness larger than that of said second to fourth oxide films. Alternatively, said second to fourth oxide films are formed maintaining thicknesses that successively increase from the lower layer toward the upper layer. Also, said first to third polysilicon films are formed maintaining thicknesses that successively increase from the lower layer toward the upper layer.

According to a further aspect of the present invention, there is provided a method of writing data into the memory cells in a nonvolatile semiconductor memory device having nonvolatile memory cells, each of said memory cells comprising a semiconductor substrate of one type of electric conduction, a source region and a drain region of the opposite type of electric conduction formed in said semiconductor substrate, an electric charge-capturing film formed on a channel region between said source region and said drain region, and a gate electrode formed on said charge-capturing film, wherein said electric charge-capturing film has a multi-layer structure in which at least four insulating films and at least three dielectric films each working as an electric charge accumulation layer are alternatingly laminated one upon the other, said method of writing data into said memory cells comprising: a step of setting a write voltage to be applied to the portions of said memory cells depending upon a value of write data; said step including a sub-step of applying, to said gate electrode, a predetermined voltage at which an electric charge is allowed to tunnel through an insulating film on the lower side of a dielectric film that captures the electric charge corresponding to a data value but at which no electric charge is allowed to tunnel through an insulating film on the upper side thereof, concerning part of said write data.

This writing method may further include a sub-step of applying a voltage to the portions of said memory cells so as to form a state where the electric charge is captured by none of said at least three dielectric films, concerning the data other than said write data.

According to a yet further aspect of the present invention, there is provided a method of reading data stored in the memory cells in a nonvolatile semiconductor memory device having nonvolatile memory cells, each of said memory cells comprising a semiconductor substrate of one type of electric conduction, a source region and a drain region of the opposite type of electric conduction formed in said semiconductor substrate, an electric charge-capturing film formed on a channel region between said source region and said drain region, and a gate electrode formed on said charge-capturing film, wherein said electric charge-capturing film has a multi-layer structure in which at least four insulating films and at least three dielectric films each working as an electric charge accumulation layer are alternatingly laminated one upon the other, said method of reading data stored in said memory cells comprising: a step of applying a first predetermined voltage to said gate electrode in order to judge to which one of the two voltage ranges the memory state of the memory cell belongs, said two voltage ranges being obtained by dividing into two a plurality of continuous ranges of threshold voltages that are set depending upon the values of the data that are read out; a step of judging whether a threshold voltage is higher than said first voltage or not upon detecting a current that flows between said source region and said drain region; a step of specifying a voltage range to which the memory state of said memory belongs based upon said judged result; a step of applying a second predetermined voltage to said gate electrode in order to judge to which one of the two voltage ranges the memory state of said memory cell belongs, said two voltage ranges being obtained by dividing said specified voltage into two; a step of judging whether a threshold voltage is higher than said second voltage or not upon detecting a current that flows between said source region and said drain region; and a step of specifying a voltage range to which the memory state of said memory belongs based upon said judged result; said steps being repeatively executed until a sole voltage range is specified to which the memory state of said memory cell belongs.

Other features in the constitution, actions and effects of the present invention will be described in detail by way of the following preferred embodiments with reference to the accompanying drawings.

DESCRIPTION OF THE PREFERRED EMBODIMENTS

Preferred embodiments of the present invention will now be described with reference to the drawings.

Figure 1:
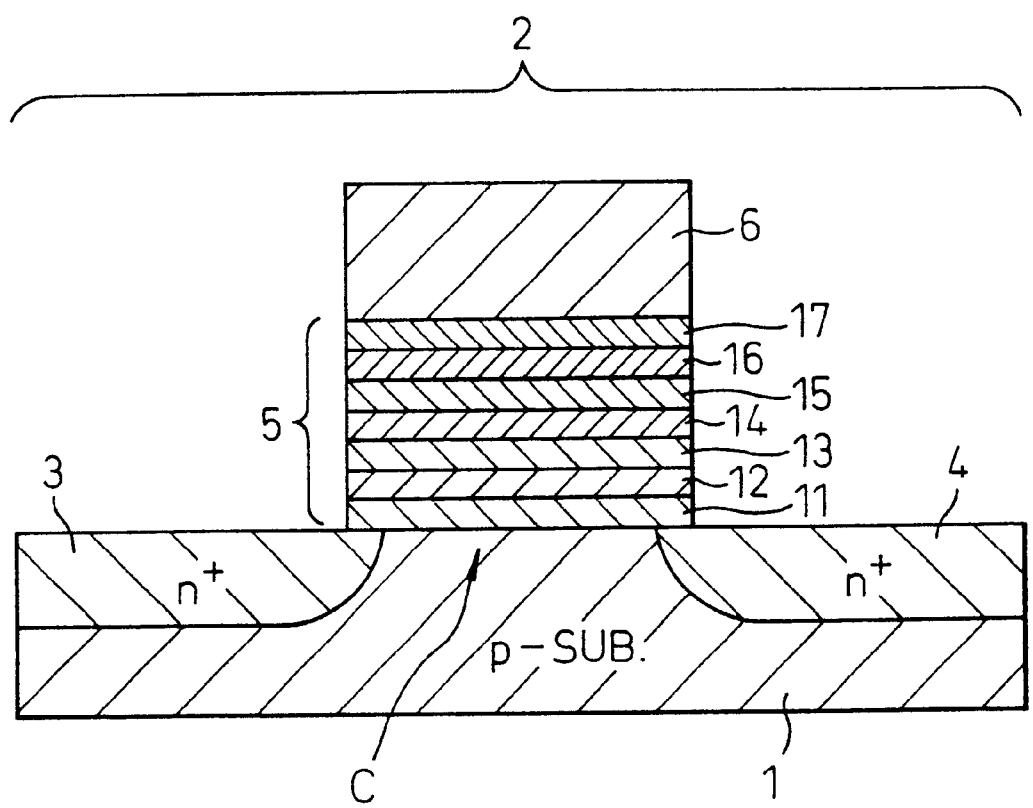
FIG. 1 is a sectional view schematically illustrating the constitution of a major portion of a nonvolatile semiconductor memory device according to an embodiment of the present invention.

FIG. 1 is a sectional view schematically illustrating the constitution of a major portion (memory cell) of a nonvolatile semiconductor memory device according to an embodiment of the present invention.

Referring to FIG. 1, a memory cell in the nonvolatile semiconductor memory device according to this embodiment comprises a p-type semiconductor (e.g., silicon) substrate 1, a pair of high-concentration n-type impurity-diffused regions (source region 3 and drain region 4) formed on the surface of an element-forming region 2 defined on the semiconductor substrate 1 by an element isolation structure such as a field oxide film or the like, a multi-layer film (electric charge-capturing film) 5 for capturing electric charge patterned on a channel region C between the source region 3 and the drain region 4, and a gate electrode 6 that works as a control electrode being patterned on the electric charge-capturing film 5. The electric charge-capturing film 5 comprises a silicon oxide film (gate oxide film) 11 that works as a gate insulating film, as well as a dielectric film (silicon nitride film in this embodiment) 12, a silicon oxide film 13, a dielectric film (silicon nitride film) 14, a silicon oxide film 15, a dielectric film (silicon nitride film) 16 and a silicon oxide film 17 that are formed on the gate oxide film 11 in the order mentioned. That is, the electric charge-capturing film 5 has a multi-layer structure in which silicon oxide films 11, 13, 15, 17 and silicon nitride films 12, 14, 16 working as electric charge accumulation layers are alternatingly laminated one upon the other. In other words, a memory cell of the MONOS structure is used in this embodiment.

Described below with reference to FIGS. 2a to 2e is a method of producing the nonvolatile semiconductor memory device according to this embodiment.

Figure 2A:
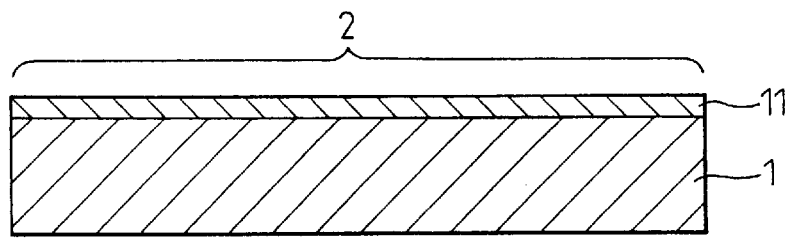
FIGS. 2a to 2e are diagrams of steps for illustrating a method of producing the nonvolatile semiconductor memory device of the embodiment of FIG. 1.

First, as shown in FIG. 2a, an element isolation structure such as a field oxide film or a field-shield element isolation structure that is not shown, is formed on the p-type semiconductor substrate 1 to define an element-forming region 2. Then, the surface of the semiconductor substrate 1 in the element-forming region 2 is thermally oxidized to form a gate oxide film 11 having a thickness of about 8.0 nm.

Figure 2B:
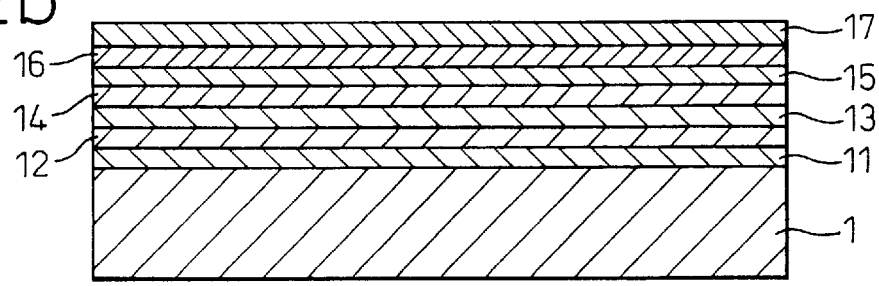

Referring, next, to FIG. 2b, a silicon nitride film 12 is formed maintaining a thickness of about 10.0 nm on the gate oxide film 11 based on a reduced-pressure CVD method. Then, about 20% of the upper layer of the silicon nitride film 12 is thermally oxidized to form a silicon oxide film 13 maintaining a thickness of about 5.0 nm. A silicon nitride film 14 similar to the silicon nitride film 12 is formed on the silicon oxide film 13, and the upper layer of the silicon nitride film 14 is thermally oxidized to form a silicon oxide film 15 similar to the silicon oxide film 13. Next, on the silicon oxide film 15 is formed a silicon nitride film 16 similar to the silicon nitride films 12 and 14, and the upper layer of the silicon nitride film 16 is thermally oxidized to form a silicon oxide film 17 similar to the silicon oxide films 13 and 15.

Figure 2C:
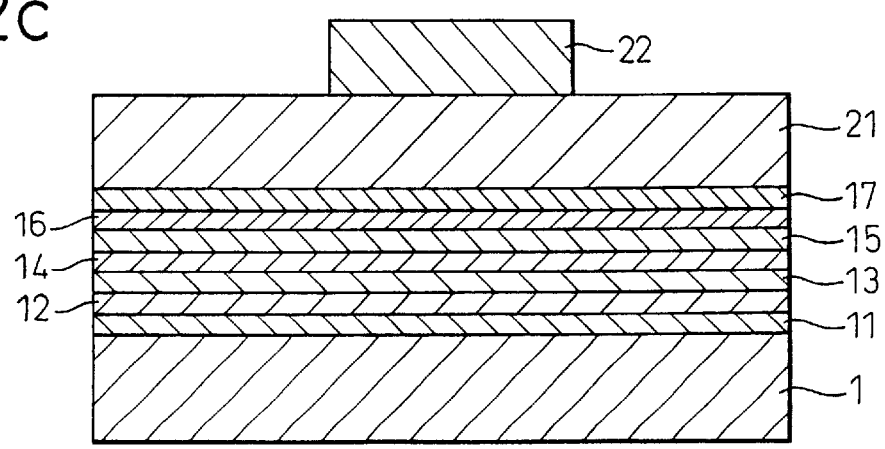

Next, as shown in FIG. 2c, a polysilicon layer 21 is formed on the silicon oxide film 17 based on the CVD method. Then, a photoresist is applied onto the polysilicon layer 21, and is machined by photolithography to form a resist 22 in the shape of the gate electrode.

Figure 2D:
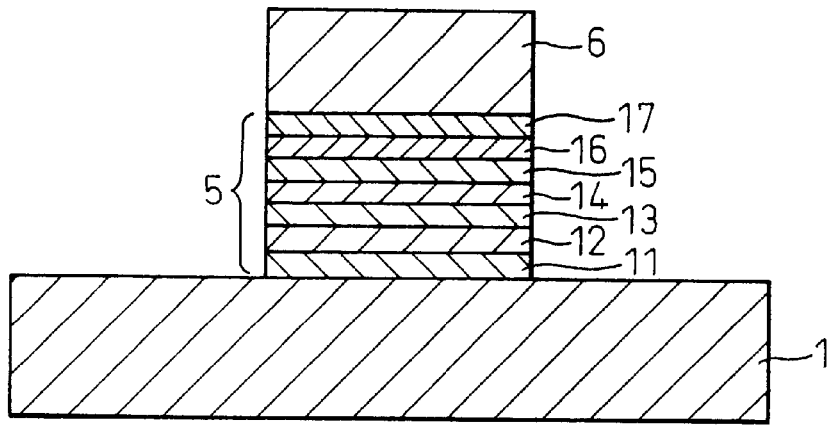

Next, as shown in FIG. 2d, the polysilicon layer 21, silicon oxide film 17, silicon nitride film 16, silicon oxide film 15, silicon nitride film 14, silicon oxide film 13, silicon nitride film 12 and gate oxide film 11 are dry-etched by using the resist 22 as a mask, and an electric charge-capturing film 5 and a gate electrode 6 having a shape that meets the shape of the resist 22 are formed on the semiconductor substrate 1 in the element-forming region 2. Next, the resist 22 is removed by ashing.

Figure 2E:
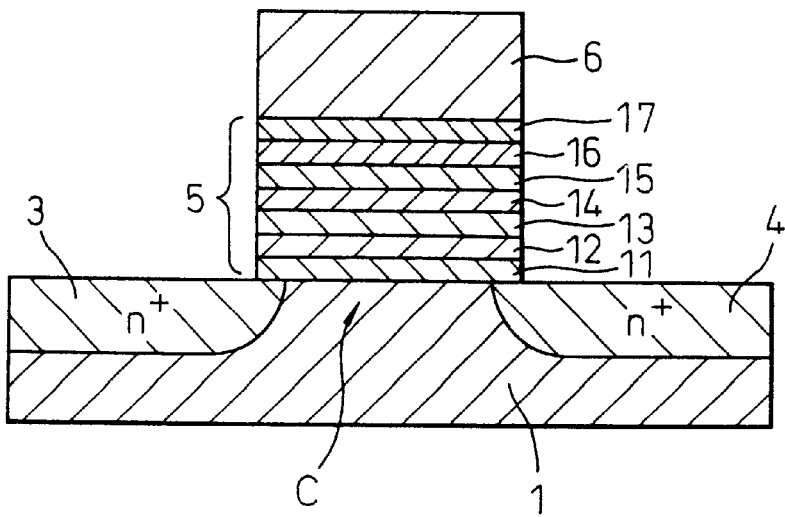

Finally, as shown in FIG. 2e, n-type impurities of a high concentration such as phosphorus (P) ions or arsenic (As) irons are added to the surface region of the semiconductor substrate 1 using the polysilicon layer 21 as a mask. Then, the semiconductor substrate 1 is annealed to form a pair of impurity-diffused regions, i.e., to form the source region 3 and the drain region 4. Thus, the channel region C is formed between the source region 3 and the drain region 4 of the semiconductor substrate 1.

Thus, a memory cell of the embodiment is fabricated. Thereafter, interlayer insulating films and various wirings are formed, using a known technology, to complete the nonvolatile semiconductor memory device of the embodiment.

7As will be described below in detail, the memory cell of this embodiment is capable of storing 2-bit data, i.e., data of 4 values, i.e., "00", "01", "10" and "11". That is, the electric charge corresponding to a voltage applied to the gate electrode 6 is captured by traps T1, T2 and T3 (see FIG. 3) existing in an interface between the silicon nitride film 12 and the underlying gate oxide film 11, in an interface between the silicon nitride film 14 and the underlying silicon oxide film 13, and in an interface between the silicon nitride film 16 and an underlying silicon oxide film 15 in the electric charge-capturing film 5, and four memory states are specified depending upon the state of the captured electric charge in the traps. Concretely speaking, a state where the electric charge is captured by none of the traps T1 to T3 is specified as data "00", a state where the electric charge is captured by the trap T1 only is specified as data "01", a state where the electric charge is captured by the traps T1 and T2 only is specified as data "10", and a state where the electric charge is captured by all traps T1 to T3 is specified as data "11".

Figure 3:
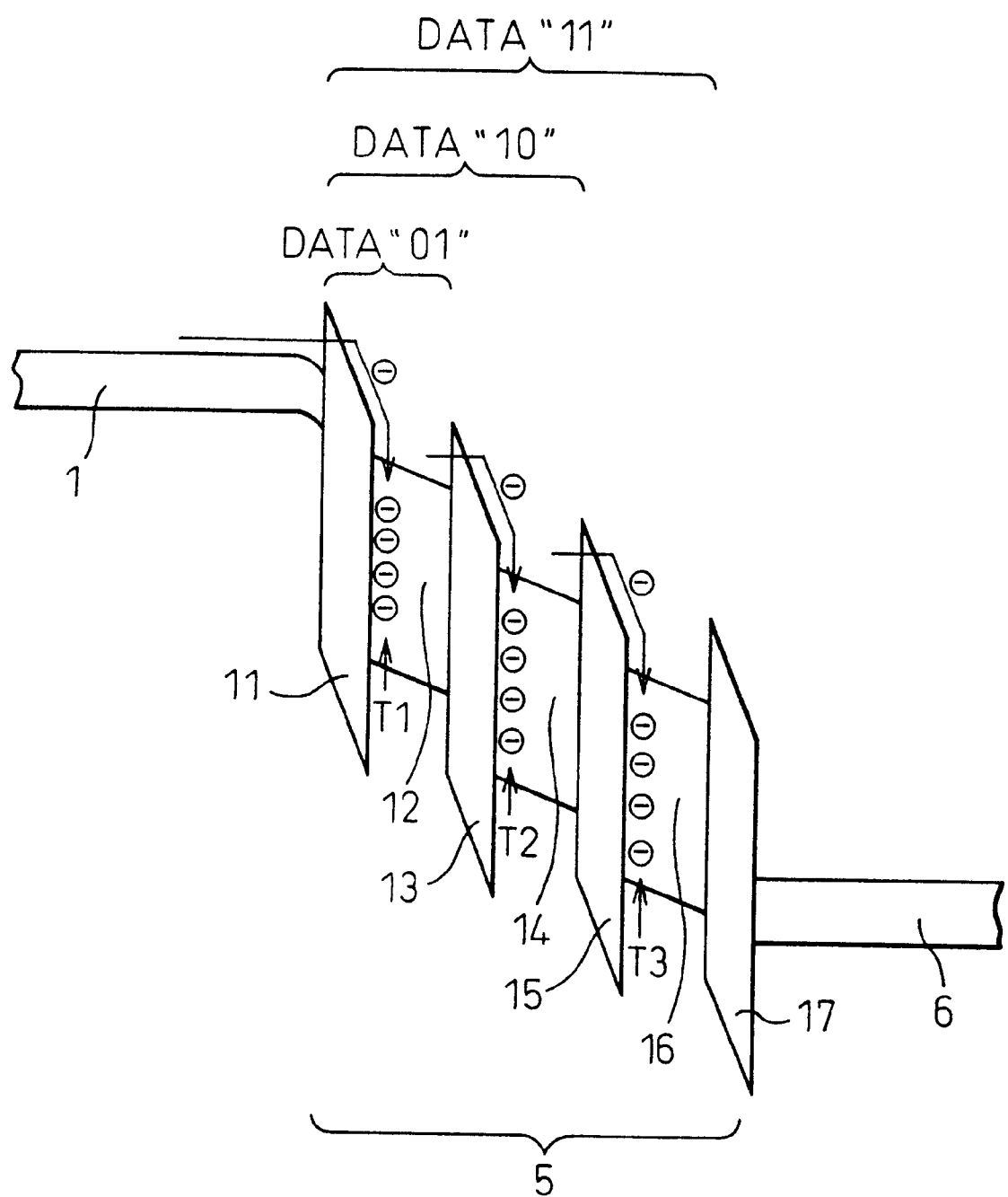
FIG. 3 is a diagram illustrating a method of writing data according to the embodiment of FIG. 1.

A method of writing data into the nonvolatile semiconductor memory device of this embodiment will now be described with reference to FIGS. 3 and 4. FIG. 3 schematically illustrates a state of capturing electric charge (electrons) by the electric charge accumulation layer (silicon nitride films 12, 14 and 16) in the electric charge-capturing film 5, and FIG. 4 is a flow chart illustrating a method of writing data.

Figure 4:
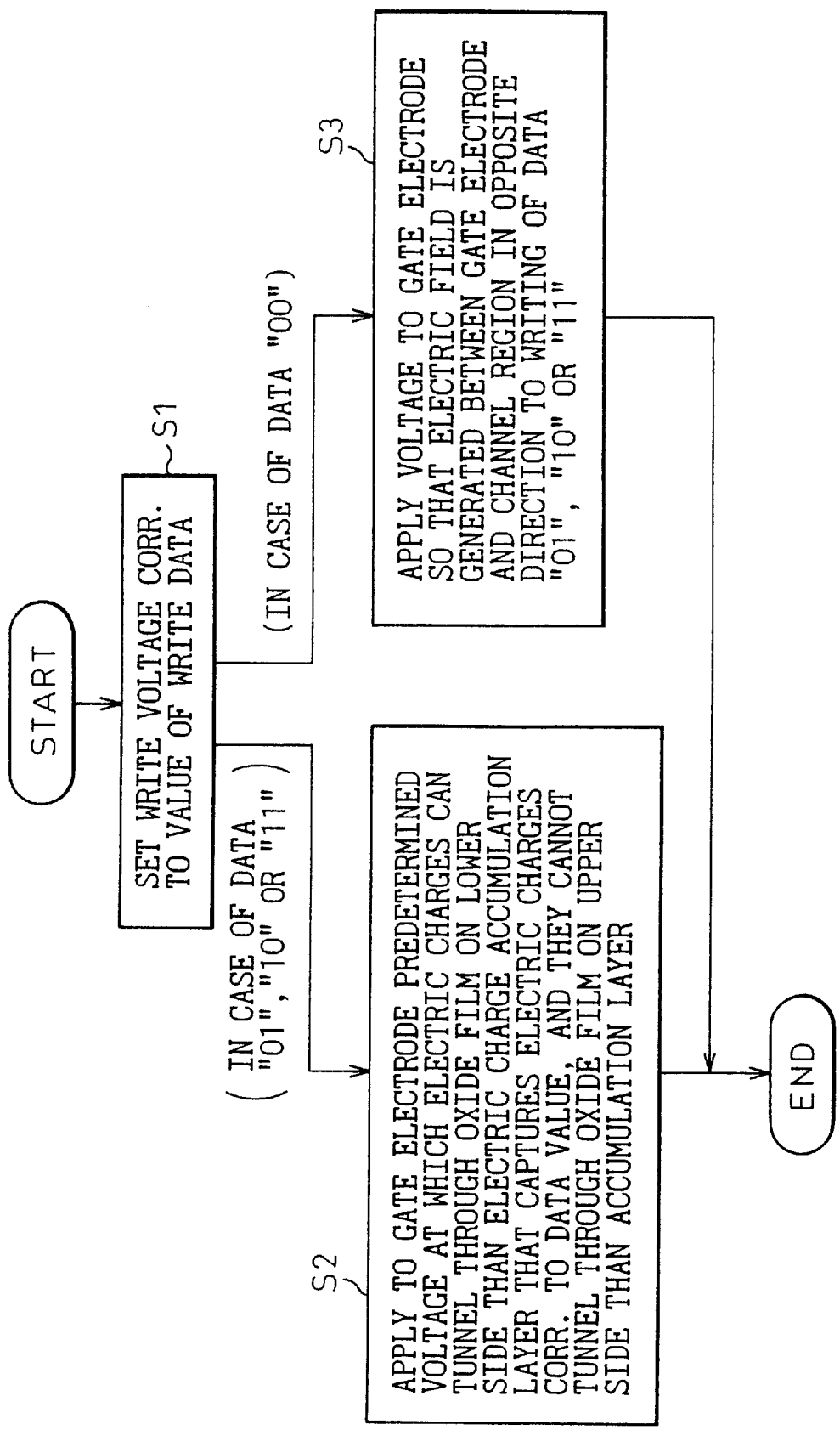
FIG. 4 is a flow chart illustrating the method of writing data.

Referring to FIG. 4, first, a write voltage (i.e., a voltage to be applied to the portions of the memory cell) is set at a step S1 depending upon a value of write data. That is, the write voltage differs depending upon if the data "01", "10" or "11" is to be written or if the data "00" is to be written.

When the data "01", "10" or "11" is to be written, as shown in a step S2, the gate electrode is applied with a predetermined voltage which allows an electric charge (electrons) to tunnel through an oxide film on the lower side of the electric charge accumulation layer (silicon nitride film) that captures electric charge corresponding to a data value but which does not allow electric charge to tunnel through an oxide film on the upper side thereof.

Concretely speaking, when, for example, the data "01" is to be written, the source region 3, drain region 4 and semiconductor substrate 1 are applied with ground potential, and the gate electrode 6 is applied with a predetermined voltage of, for example, about 4 V at which the electrons are allowed to tunnel through the gate oxide film 11 but at which no electron is allowed to tunnel through the silicon oxide film 13. In this case, electrons existing in the channel region C assume a high energy state due to an electric field generated between the gate electrode 6 and the channel region C, and some of the electrons tunnel through the gate oxide film 11. However, the electrons do not possess enough energy to tunnel through the silicon oxide film 13 and are captured by the trap T1 in the silicon nitride film 12. This means that the data "01" is stored in the memory cell.

Similarly, when the data "10" is to be written, the source region 3, drain region 4 and semiconductor substrate 1 are applied with ground potential, and the gate electrode 6 is applied with a predetermined voltage of, for example, about 6 V at which the electrons are allowed to tunnel through the gate oxide film 11 and the silicon oxide film 13 but at which no electron is allowed to tunnel through the silicon oxide film 15. In this case, electrons existing in the channel region C assume a high energy state due to an electric field generated between the gate electrode 6 and the channel region C, whereby some of the electrons tunnel through the gate oxide film 11 and among them, some of the electrons are captured by the trap T1 in the silicon nitride film 12. The electrons that are not captured tunnel through the silicon oxide film 13. The electrons, however, do not have enough energy to tunnel through the silicon oxide film 15 and are, hence, captured by the trap T2 in the silicon nitride film 14. After all, the electrons are captured by the traps T1 and T2 in the silicon nitride films 12 and 14. This means that the data "10" is stored in the memory cell.

Similarly, when the data "11" is to be written, the source region 3, drain region 4 and semiconductor substrate 1 are applied with ground potential, and the gate electrode 6 is applied with a predetermined voltage of, for example, about 8 V at which the electrons are allowed to tunnel through the gate oxide film 11 and the silicon oxide films 13, 15 but at which no electron is allowed to tunnel through the silicon oxide film 17. In this case, electrons existing in the channel region C assume a high energy state due to an electric field generated between the gate electrode 6 and the channel region C, whereby some of the electrons tunnel through the gate oxide film 11 and silicon oxide films 13 and 15. Here, some of the electrons can be grouped into those captured by the trap T1 in the silicon nitride film 12, those having energy large enough to tunnel through the silicon oxide film 13 but is not large enough to tunnel through the silicon oxide film 15 and are captured by the trap T2 in the silicon nitride film 14, and those having energy large enough to tunnel through the silicon oxide film 15 but is not large enough to tunnel through the silicon oxide film 17 and are captured by the trap T3 in the silicon nitride film 16. That is, the electrons are captured by the traps T1, T2 and T3 in the silicon nitride films 12, 14 and 16. This means that the data "11" is stored in the memory cell.

On the other hand, when the data "00" is to be written as shown in a step S3 of FIG. 4, a voltage is applied to the gate electrode so that an electric field is generated between the gate electrode and the channel region in a direction opposite to that of when the data It "01", "10" or "11" is written. Concretely speaking, a voltage of about 8 V is applied to the source region 3, drain region 4 and semiconductor substrate 1, and the gate electrode 6 is connected to ground potential. Accordingly, the electric field is generated in a direction opposite to that of when the above-mentioned data "00", "10" or "11" is written, and the electrons are returned to the channel region C. This is a state where the electrons are captured by none of the silicon nitride film 12, 14 or 16, meaning that the data is erased or, in other words, the data "00" is stored in the memory cell.

When the processing of the step S2 or S3 ends, the flow for writing data ends.

Figure 5:
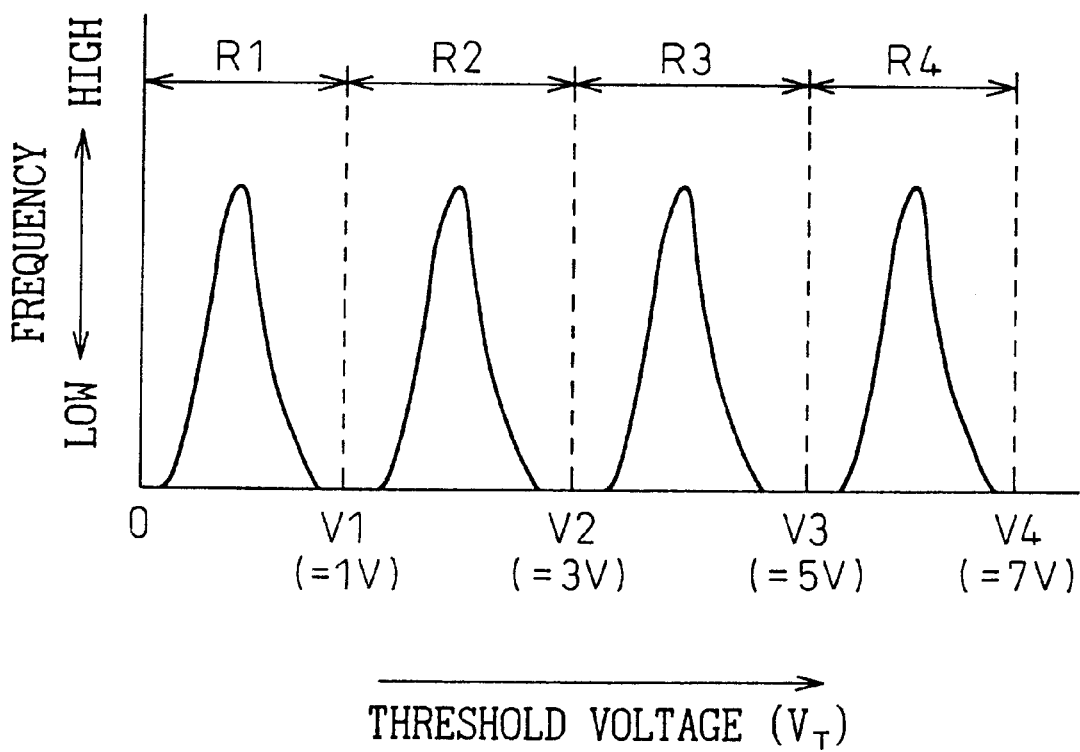
FIG. 5 is a diagram illustrating a method of reading data according to the embodiment of FIG. 1.
Figure 6:
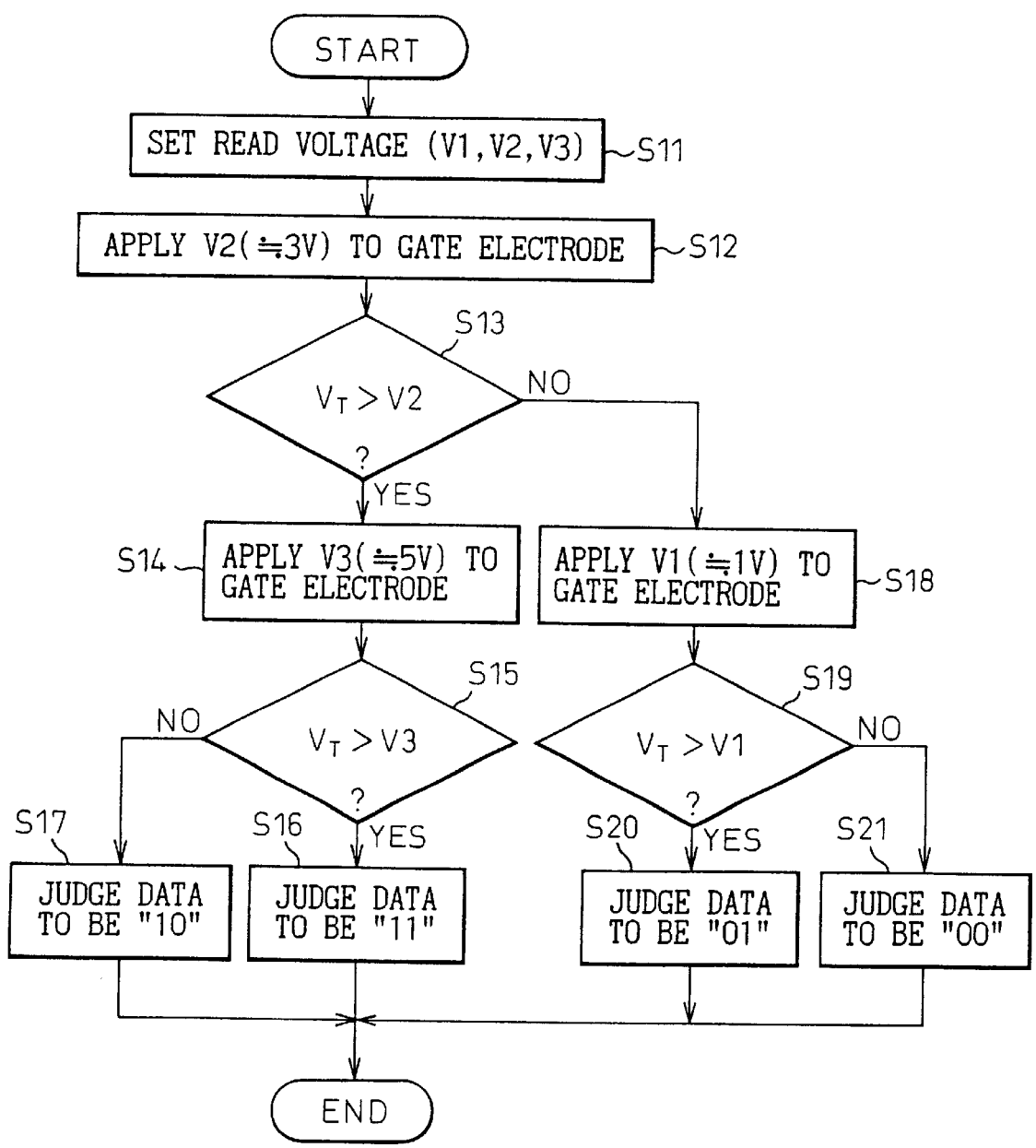
FIG. 6 is a flow chart illustrating the method of reading data.

Next, a method of reading data from the nonvolatile semiconductor memory device according to the embodiment will be described with reference to FIGS. 5 and 6. FIG. 5 illustrates a distribution of threshold voltages, and FIG. 6 is a flow chart illustrating the method of reading data.

In this embodiment as shown in FIG. 5, peak values are exhibited at threshold voltages ($V_T$) of about 0.1 V, about 2 V, about 4 V and about 6 V. That is, when a threshold voltage $V_T$ is detected in a voltage range indicated as R1, the memory state is judged to be "00". When the threshold voltage $V_T$ is detected in a voltage range indicated as R2, the memory state is judged to be "01". When the threshold voltage $V_T$ is detected in the voltage range indicated as R3, the memory state is judged to be "10", and when the threshold voltage $V_T$ is detected in the voltage range indicated as R4, the memory state is judged to be "11".

The method will now be described with reference to the flow chart of FIG. 6.

At a step S11, first, a read voltage (V1, V2, V3) is set for reading data from the memory cell. In this embodiment, the voltages are set in a manner of V1=1 V, V2≈3 V, and V3≈5 V. At a next step S12, a read voltage of V2 (≈3 V) is applied to the gate electrode 6 in order to judge whether the memory state of the memory cell is in the voltage range R1 or R2 or in the voltage range R3 or R4. In this case, a voltage of about 5 V is applied between the source region 3 and the drain region 4.

At a next step S13, a drain current flowing between the source region 3 and the drain region 4 is detected by a sense amplifier, and it is judged whether $V_T$ is higher than V2 (YES) or not (NO). When the judged result is YES ($V_T>V2$), i.e., when no current flows into the channel region C, it is judged that the memory state of the memory cell is in the voltage region R3 or R4, and the program proceeds to a step S14. When the judged result is NO ($V_T \leq V2$), on the other hand, i.e., when a current flows into the channel region C, it is judged that the memory state of the memory cell is in the voltage range R1 or R2, and the program proceeds to a step S18.

At the step S14, a read voltage of V3 (≈5 V) is applied to the gate electrode 6 in order to judge in which voltage range R3 or R4 the memory state of the memory cell lies. In this case, a voltage of about 5 V, the same as the one described above, is applied between the source region 3 and the drain region 4. At a next step S15, in the same manner, a drain current flowing between the source region 3 and the drain region 4 is detected by a sense amplifier or the like in order to judge whether $V_T$ is higher than V3 (YES) or not (NO). When the judged result is YES ($V_T$>V3), i.e., when no current flows into the channel region C, it is judged that the memory state of the memory cell is in the voltage range R4, and it is judged at a next step S16 that the data is "11". When the judged result is NO ($V_T$≦V3), on the other hand, i.e., when a current flows into the channel region C, it is judged that the memory state of the memory cell is in the voltage range R3, and it is judged at a next step S17 that the data is "10".

At a step S18, on the other hand, a read voltage of V1 (≈1 V) is applied to the gate electrode 6 in order to judge whether the memory state of the memory cell is in the voltage range R1 or R2. In this case, the voltage of about 5 V, the same as the one mentioned above, is applied between the source region 3 and the drain region 4. At a next step S19, similarly, a drain current flowing between the source region 3 and the drain region 4 is detected by a sense amplifier or the like in order to judge whether $V_T$ is higher than V1 (YES) or not (NO). When the result of judgement is YES ($V_T$>V1), i.e., when no current is flowing into the channel region C, it is judged that the memory state of the memory cell is in the voltage range R2, and it is judged at a next step S20 that the data is "01". When the judged result is NO ($V_T$≦V1), on the other hand, i.e., when a current flows into the channel region C, it is judged that the memory state of the memory cell is in the voltage range R1, and it is judged at a next step S21 that the data is "00".

When the processings at the steps S16, S17, S20 and S21 are finished, the flow for reading data ends.

According to the nonvolatile semiconductor memory device of this embodiment as described above, the electric charge-capturing film 5 has a multi-layer structure formed by alternatingly laminating silicon oxide films 11, 13, 15 and silicon nitride films 12, 14, 16 one upon the other. Therefore, four kinds of different electric charge-capturing states are formed depending upon the amount of electric charge captured by the electric charge accumulation layers (silicon nitride films 12, 14 and 16), and memory states of four values ("00", "01", "10" and "11") are realized depending upon the electric charge-capturing states.

Accordingly, the amount of capture of the electric charge can be easily and reliably adjusted to store desired multi-value data while preventing the occurrence of an inconvenience such as data corruption. Moreover, the electric charge-capturing film 5 of the multi-layer structure makes it possible to further decrease the memory cell area and contributes greatly to realizing a nonvolatile semiconductor memory device having a very high degree of integration in a chip of a small size.

The foregoing embodiment (see FIG. 1) has dealt with the case where a plurality of silicon oxide films and a plurality of silicon nitride films were alternatingly laminated one upon the other in a multi-layer structure to realize a multi-value memory, the silicon oxide films (excluding the gate oxide film 11) having the same thickness. However, the film thickness need not be necessarily limited thereto.

Figure 7:
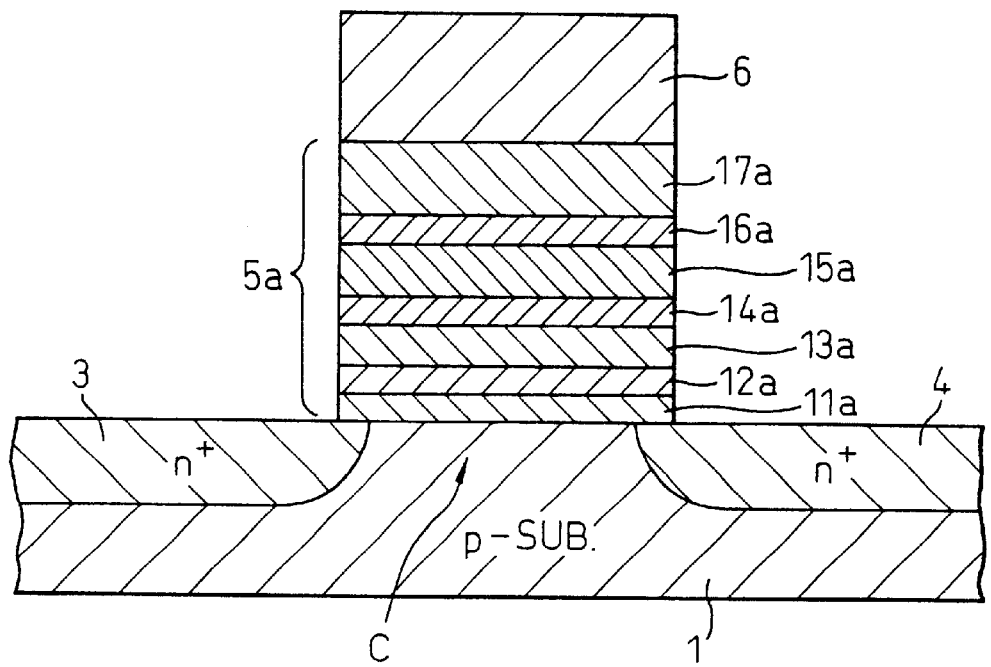
FIG. 7 is a sectional view schematically illustrating the constitution of a modified example of the embodiment of FIG. 1.

FIG. 7 schematically illustrates the constitution of a modified example of the embodiment of FIG. 1.

The diagramed memory cell has the same MONOS structure as that of the memory cell shown in FIG. 1. That is, reference numeral 5a denotes an electric charge-capturing film, reference numerals 11a, 13a, 15a and 17a denote silicon oxide films, and reference numerals 12a, 14a and 16a denote silicon nitride films working as electric charge accumulation layers. In the memory cell shown in FIG. 7, when, for example, the silicon oxide film (gate oxide film) 11a is formed maintaining a thickness of about 2.0 nm on the p-type silicon substrate 1, the silicon oxide films 13a, 15a and 17a are formed thereon maintaining thicknesses of 3.0 nm, 4.0 nm and 5.0 nm, respectively.

Thus, the silicon oxide films are formed maintaining thicknesses that successively increase from the lower side toward the higher side, offering an advantage in that writing of data can be easily controlled. When the electric charge is to be captured by a desired electric charge accumulation layer (silicon nitride film), a predetermined voltage must be applied to the gate electrode so that the electric charge is allowed to easily tunnel through the silicon oxide film of the lower side and that the electric charge is not allowed to tunnel through the silicon oxide film of the upper side, as in the case of the method of writing data described above with reference to FIGS. 3 and 4. In this case, it is desired that the silicon oxide film of the upper side through which the electric charge should not tunnel has a thickness greater than that of the silicon oxide film of the lower side through which the electric charge should tunnel. In the example of FIG. 7 as described above, the thickness of the silicon oxide films is successively increased toward the upper side, so that required electric charge is reliably captured by a desired electric charge accumulation layer (silicon nitride film). That is, writing of data can be easily controlled.

To write the data in this embodiment, ground potential is applied to the source region 3, drain region 4 and semiconductor substrate 1, and a predetermined voltage is applied to the gate electrode 6 as described in connection with FIGS. 3 and 4. Though the number of the electric charge accumulation layers (silicon nitride films) may differ depending upon the value of data that is to be written, the voltage applied to the gate electrode 6 is suitably controlled so that the electric charge is accumulated in a desired electric charge accumulation layer. That is, the voltage is so controlled as to maintain a constant relationship between the voltage applied to the gate electrode 6 and the thickness of the insulating film (silicon oxide film in this case) from the semiconductor substrate 1 to a desired electric charge accumulation layer, i.e., to maintain V/Tox constant, wherein V denotes the applied voltage and Tox denotes the thickness of the insulating film up to the electric charge accumulation layer.

In the example of FIG. 7, the thicknesses of the silicon oxide films 13a, 15a and 17a only were changed. It is, however, also allowable to form the silicon nitride films 12a, 14a and 16a in a manner that their thicknesses successively increase from the lower lower toward the upper layer. In this case, writing of data can be more easily controlled.

Figure 8:
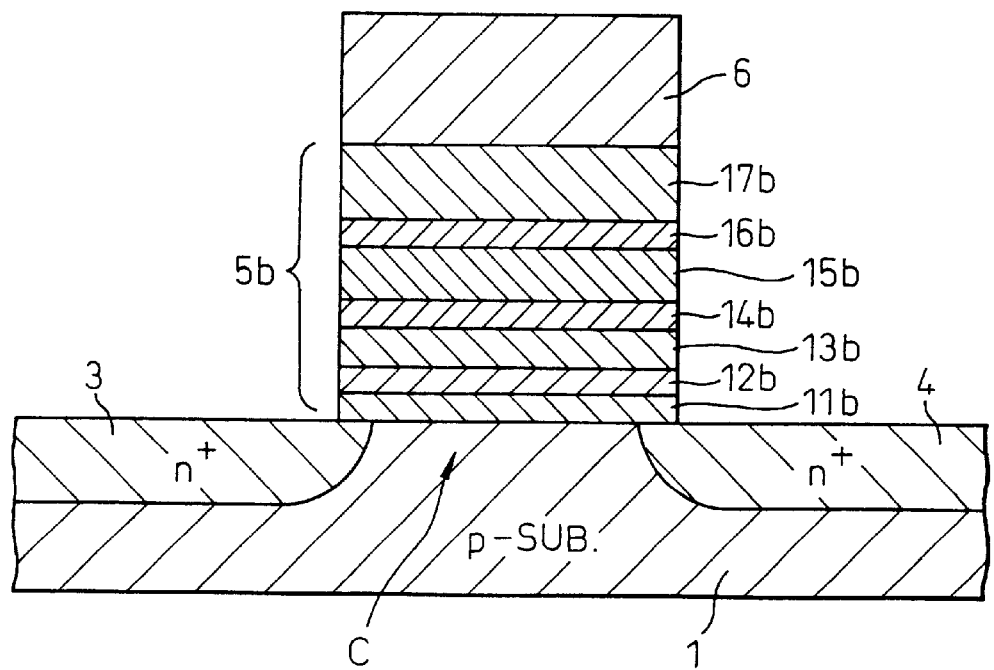
FIG. 8 is a sectional view schematically illustrating the constitution of another modified example of the embodiment of FIG. 1.

FIG. 8 schematically illustrates the constitution of another modified example of the embodiment of FIG. 1.

The memory cell shown in FIG. 8 has floating gates 12b, 14b and 16b composed of polysilicon films working as electric charge accumulation layers instead of the silicon nitride films 12a, 14a and 16a that work as electric charge accumulation layers in the memory cell shown in FIG. 7. That is, the example of FIG. 8 has a memory cell structure of the floating gate type. In the memory cell shown in FIG. 8, similarly, when the silicon oxide film (gate oxide film) 11b is formed maintaining a thickness of about 6.0 nm on the p-type silicon substrate 1, the silicon oxide films 13b, 15b and 17b on the upper side are formed maintaining thicknesses of 7.0 nm, 8.0 nm and 9.0 nm, respectively.

This makes it possible to obtain the same advantage (for facilitating the control of data writing) as the memory cell of FIG. 7. Not only the silicon oxide films 13b, 15b and 17b but also the floating gates 12b, 14b and 16b may be so formed, as required, that their thicknesses successively increase from the lower layer toward the upper layer.

In the case of, for example, four values in the multi-value memory of a prior art, the data are stored by controlling the threshold voltage of the memory cell to be 0.5 V, 1.5 V, 2.5 V and 3.5 V. According to the prior art disclosed in the above-mentioned Japanese Unexamined Patent Publication (Kokai) No. 7-273227, for example, the threshold value is so controlled as to be varied by a predetermined value every time when the multi-value increases by one. In the nonvolatile memories of the floating gate type and the MONOS type, as is well known, a preset threshold voltage drops due to a leakage of the accumulated electric charge giving rise to the occurrence of data corruption. When the data is stored at a high threshold voltage, in particular, the threshold voltage drops in large amounts causing the data to be corrupted with a high probability.

In order to cope with this according to an embodiment of the present invention, the threshold voltages assigned to the multi-value data are not equally divided (are not changed by a predetermined value (1.0 V in the above-mentioned example) for every increase in the multi-value by 1 effected in the prior art) but, instead, the width of the threshold voltage is increased with an increase in the threshold voltage. In the case of, for example, four values, the data "00" sets the threshold voltage to be 0.5 V, the data "01" sets the threshold voltage to be 1.0 V, the data "10" sets the threshold voltage to be 2.0 V, the data "11" sets the threshold voltage to be 4.0 V, the data "00" and "01" set the threshold value to be 0.75 V, the data "01" and "10" set the threshold value to be 1.5 V, and the data "10" and "11" set the threshold value to be 3.0 V.

In this case, the threshold voltage is controlled so that a relationship is maintained constant between the voltage (V) applied to the gate electrode and the thickness of the insulating film (Tox) from the semiconductor substrate to the electric charge accumulation layer, i.e., so that V/Tox is maintained constant.

Thus, the magnitude of the threshold voltage is increased by 100% (not by a predetermined value) as the multi-value increases every time by 1, in order to effectively prevent the occurrence of data corruption.

Figure 9A:
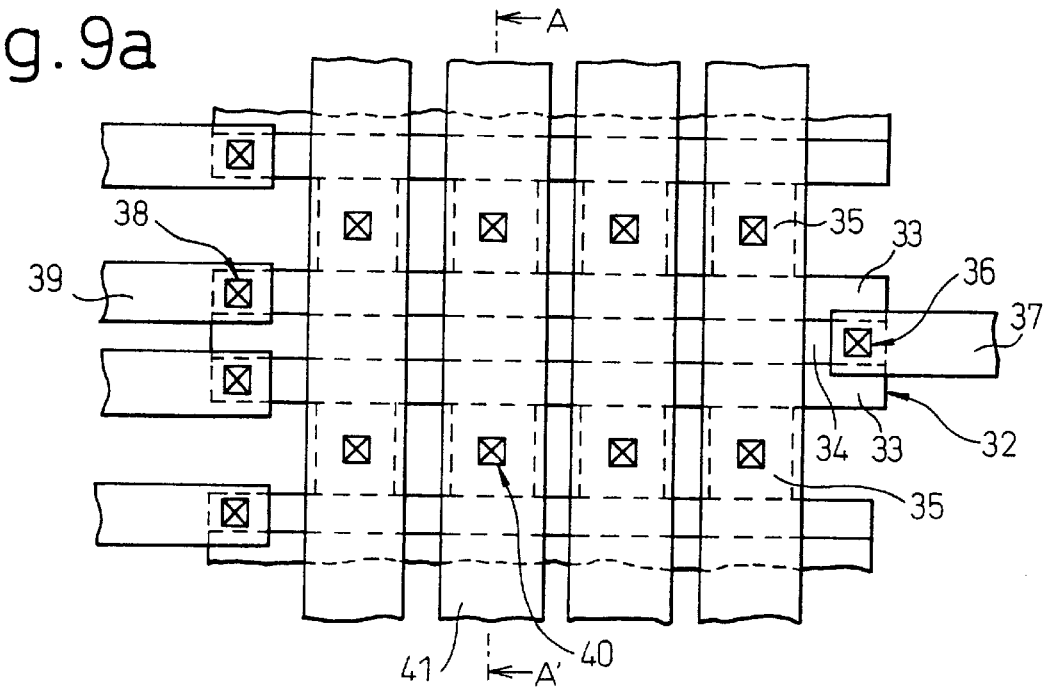
FIGS. 9a to 9c are diagrams schematically illustrating the constitution of a major portion of the nonvolatile semiconductor memory device according to another embodiment of the present invention.
Figure 9B:
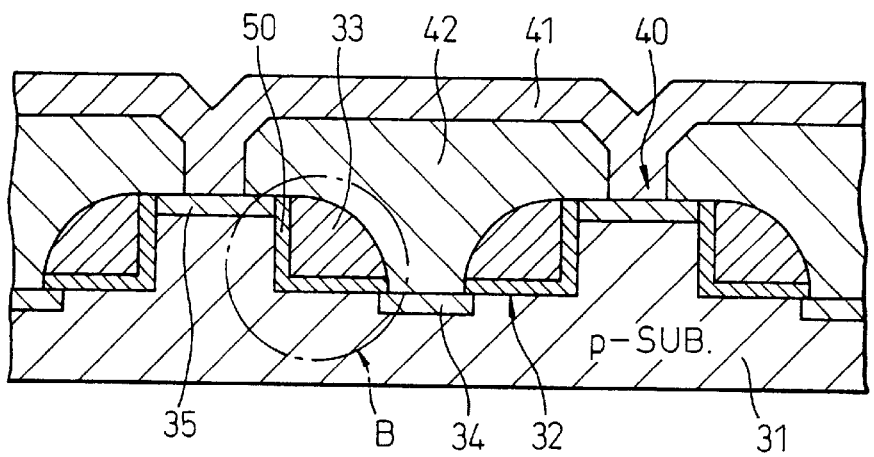
Figure 9C:
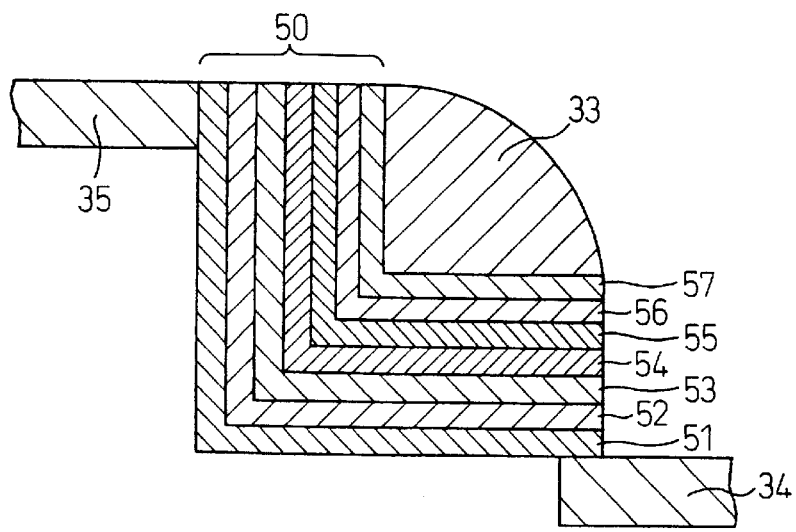

FIGS. 9a to 9c schematically illustrate the constitution of the major portion of the nonvolatile semiconductor memory device according to another embodiment of the present invention, wherein FIG. 9a is a plan view, FIG. 9b is a sectional view along the line A–A' of FIG. 9a, and FIG. 9c is a diagram illustrating a portion B of FIG. 9b on an enlarged scale.

In this embodiment as shown in FIGS. 9a to 9c, a trench 32 is formed in a rectangular parallelopiped shape having a predetermined depth in the surface of a p-type semiconductor (e.g., silicon) substrate 31. Multi-layer films 50 for capturing electric charge are formed in an L-shape spanning across the opposing two side walls (right and left side walls relative the surface of the paper in FIG. 9b) among the four side walls of the trench 32 and part of the region on the bottom in contact with the side walls, and gate electrodes 33 are formed so as to cover the electric charge-capturing films 50. The electric charge-capturing film 50 comprises a silicon oxide film (gate oxide film) 51 working as a gate-insulating film, as well as a dielectric film (silicon nitride film in this embodiment) 52, a silicon oxide film 53, a dielectric film (silicon nitride film) 54, a silicon oxide film 55, a dielectric film (silicon nitride film) 56 and a silicon oxide film 57 that are successively laminated on the gate oxide film 51. That is, the electric charge-capturing film 50 has a multi-layer structure in which the silicon oxide films 51, 53, 55 and 57, and the silicon nitride films 52, 54 and 56 working as electric charge accumulation layers are alternatingly laminated one upon the other. That is, this embodiment uses the memory cell of the MONOS structure like in the embodiment of FIG. 1.

Reference numeral 34 denotes a source region formed relative to the gate electrodes 33 via the electric charge accumulation films 50 in a region of the bottom of the trench 32 other than the regions where the gate electrodes 33 are formed. Reference numeral 35 denotes a drain region formed relative to the gate electrodes 33 via the electric charge-capturing films 50 in a region other than the region where the trench 32 is formed on the semiconductor substrate 31. Furthermore, a contact hole 36 is formed to connect an electrically conducting film (metal wiring) 37 to the source region 34, a contact hole 38 is formed to connect an electrically conducting film (metal wiring) 39 to the gate electrode 33, and a contact hole 40 is formed to connect an electrically conducting film (metal wiring) 41 to the drain region 35. In FIG. 9b, a portion designated at 42 represents an interlayer insulating film.

A method of producing the nonvolatile semiconductor memory device of this embodiment will now be described with reference to FIGS. 10a to 10e.

Figure 10A:
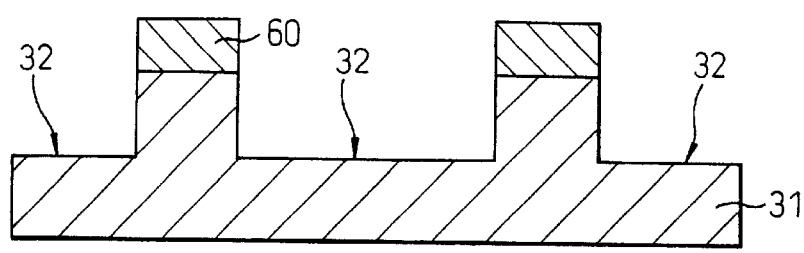
FIGS. 10a to 10e are diagrams of steps to illustrate a method of producing the nonvolatile semiconductor memory device of the embodiment of FIGS. 9a to 9c.

As shown in FIG. 10a, first, an element isolation region is formed at a predetermined position on the semiconductor substrate 31. The element isolation region is formed by a known LOCOS method or any other element isolation technology. Then, the regions other than the memory cell-forming regions are masked with a resist 60, and the trench 32 is formed maintaining a depth of about 0.3 $\mu$m by a known dry-etching method. Thereafter, the resist 60 is removed by incineration or the like.

Figure 10B:
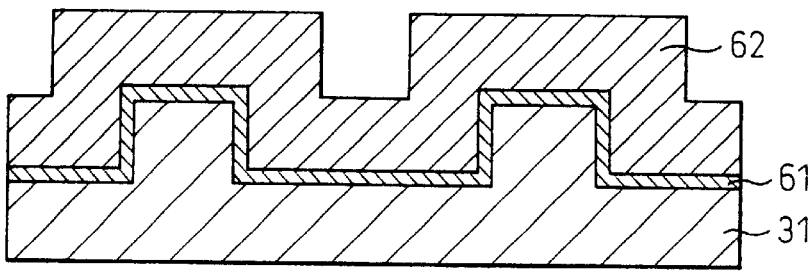

Referring next to FIG. 10b, a multi-layer laminated film 61 is formed so as to cover the whole surface of the semiconductor substrate 31. The multi-layer laminated film 61 is formed by, first, oxidizing the surface of the semiconductor substrate 31 in an $H_2O$ atmosphere to form a gate oxide film 51 (see FIG. 9c, the same holds hereinafter) maintaining a thickness of 8 nm, forming a silicon nitride film 52 maintaining a thickness of 8 nm on the gate oxide film 51 by the CVD method, forming a silicon oxide film 53 maintaining a thickness of 5 nm on the silicon nitride film 52 by the CVD method, and, then, forming another two multi-layer films (silicon nitride film 54 and silicon oxide film 55, silicon nitride film 56 and silicon oxide film 57) the same as the silicon nitride film 52 and the silicon oxide film 53 in the same manner as described above. On the multi-layer laminated film 61 is then formed a polysilicon film 62 maintaining a thickness of 150 nm by the CVD method.

Next, as shown in 10c, the whole region on where the polysilicon film 62 is formed is subjected to the an isotropic dry-etching. Thus, L-shaped electric charge-capturing films 50 and gate electrodes 33 are formed on only the two opposing side walls of the trench 32 and on some regions (up to 0.2 µm from the side walls in this embodiment) on the bottom in contact with the two side walls. Then, among the four side walls of the trench 32, the other unnecessary opposing two sides are removed by wet-etching.

Figure 10C:
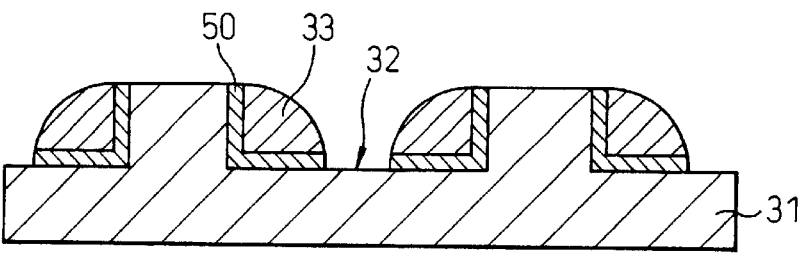
Figure 10D:
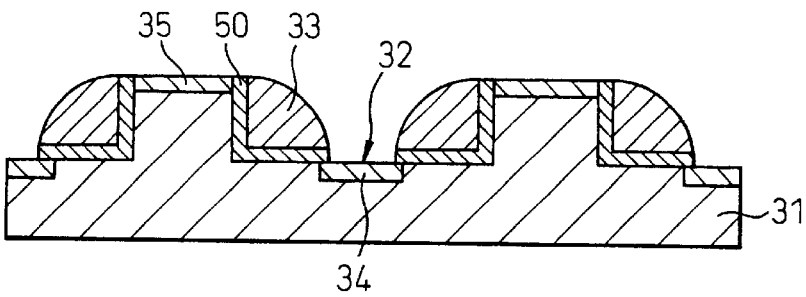

Then, as shown in FIG. 10d, arsenic (As) ions are added to the whole memory cell region at an acceleration energy of 70 keV and a dosage of $5.0 \times 10^{15}/cm^2$ to thereby form a source region 34 and a drain region 35.

Figure 10E:
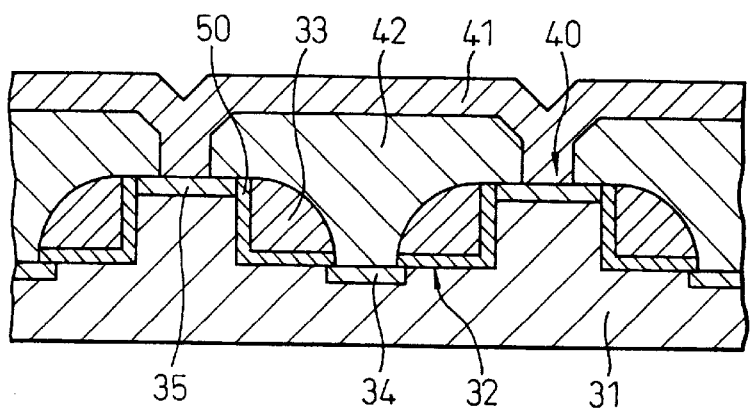

Finally, as shown in FIG. 10e, an interlayer insulating film 42, a contact hole 40 (36, 38), an electrically conducting film or wiring 41 (37, 39) and the like are formed relying on a prior art to thereby complete the nonvolatile semiconductor memory device of this embodiment.

According to the constitution of the nonvolatile semiconductor memory device of this embodiment, the electric charge-capturing film 50 has a multi-layer structure in which the silicon oxide films 51, 53, 55, 57 and the silicon nitride films 52, 54, 56 are alternatingly laminated one upon the other, making it possible to exhibit the same effects as those of the embodiment of FIG. 1 (i.e., making it possible to easily and reliably adjust the amount of capturing electric charge, to store desired multi-value data while preventing the occurrence of an inconvenience such as data corruption, and to further decrease the memory cell areas).

Furthermore, the electric charge-capturing film 50 and the gate electrode 33 for storing the data on multiplicity of levels are formed on only the two opposing side walls of the trench 32 and on some regions on the bottom contacted to the two side walls, the drain region 35 is formed relative to the gate electrode 33 via the electric charge-capturing film 50 on a region other than the region where the trench 32 is formed on the semiconductor substrate 31, and the source region 34 is formed relative to the gate electrode 33 via the electric charge-capturing film 50 on a region other than the region where the gate electrode 33 is formed on the bottom of the trench 32. In other words, the electric charge-capturing film 50 is formed in an L-shape.

Owing to this constitution, the channel region formed between the source region 34 and the drain region 35 right under the gate oxide film 51 which is the lowermost layer of the electric charge-capturing film 50 becomes longer than the width of the gate electrode 33, making it possible to form the element more finely.

According to the production method of this embodiment, furthermore, the gate electrode 33 is formed through a step shown in FIG. 10c, i.e., through a simple an isotropic dry-etching without requiring the positioning precision that was needed in the prior art.

Though the above-mentioned embodiments have dealt with the nonvolatile semiconductor memory device for storing 4-value data, it should be noted that the invention is in no way limited thereto only. In principle, the present invention can be applied to the nonvolatile semiconductor memory device for storing data having a value n ($=2^m$) where n is a natural number of not smaller than 4, and m is a natural number of not smaller than 2. When, for example, n=8 (m=3), then, eight silicon oxide films and seven silicon nitride films are alternatingly laminated on the gate oxide film to form electric charge-capturing films. In this case, electric charges corresponding to voltages applied to the gate electrode are captured by the traps existing in the interfaces between the silicon nitride films and the underlying silicon oxide films, the electric charge-captured states of eight different kinds are formed depending upon the amounts of electric charge captured, and memory states of eight values ("000", "001", "010", "011", "100", "101", "110" and "111") are realized depending upon the electric charge-captured states.

In the above-mentioned embodiments, furthermore, the interface was flatly formed between the silicon nitride film or the floating gate working as an electric charge accumulation layer and the underlying silicon oxide film. However, the shape of the interface is in no way limited thereto only. For instance, the interface may be formed in a corrugated shape. In this case, an effective area for capturing the electric charge increases, and it is expected that the data can be written more stably.

The above-mentioned embodiments have dealt with the case where a p-type semiconductor was used as the semiconductor substrate. It is, however, possible to use an n-type semiconductor having an opposite type of electric conduction as a matter of course. In this case, the electric charge migrating from the channel region toward the gate electrode due to an electric field generated by a voltage applied to the gate electrode is not made up of electrons but is made up of holes. In this case, too, therefore, the constituent features (i.e., the thickness of the silicon oxide film is successively increased from the lower layer toward the upper layer) of the memory cell shown in FIGS. 7 and 8 can be directly applied.

Moreover, the embodiment shown in FIG. 8 has dealt with the case where the silicon oxide films 11b, 13b, 15b and 17b were used as insulating films. It should, however, be noted that the insulating films are in no way limited thereto only. For example, an insulating film including an ON film (oxide film, nitride film) or an insulating film including an ONO film (oxide film, nitride film, oxide film) may be used instead of the silicon oxide film. In particular, it is most desired to use the ONO film instead of the silicon oxide films 13b, 15b and 17b.

Although, as shown in FIG. 1 (also in FIGS. 2, 7, 8 and 9), the present embodiment employs silicon oxides 11 (11a, 11b, 51), 13 (13a, 13b, 53), 15 (15a, 15b, 55) and 17 (17a, 17b, 57), such silicon oxides may be replaced by ferroelectric films.

If a ferroelectric film is used, the dielectric film (which means, in this embodiment, a silicon nitride film or a conductive poly-silicon film) 12 (12a, 12b, 52), 14 (14a, 14b, 54), 16 (16a, 16b, 56) or 18 (18a, 18b, 58) can be replaced by a film made of platinum, a titanium compound, a tungsten compound or a ruthenium compound. It may also be formed of a double layer structure in which a conductive film made of, for example, poly-silicon is provided under a platinum film.

Any material having a ferroelectric characteristic can be used as a material of the above-mentioned ferroelectric film. For example, PZT (lead zirconate titanate), PLZT (lead lanthanum zirconate titanate), barium titanate, palladium titanate, barium strontium titanate and bismuth titanate can be used as the material of the ferroelectric film. A dielectric film made of, for example, tantalic oxides or $Ta_2O_5BSTO$, which has a high dielectric constant of more than 50, can be used instead of the ferroelectric film.

As shown in FIG. 1 (also, in FIG. 9c), electric charge-capturing film 5 (50) may be formed as a multi-layer structure which includes a plurality of insulating films having a different dielectric constant. In addition, as shown in FIG. 1 (also, in FIG. 9c), electric charge-capturing film 5 (50) may be formed as a multi-layer structure which includes a plurality of ferroelectric films having a different dielectric constant.

The present invention encompasses programs for operating various devices and means for supplying the programs to the computer, such as a recording medium recording programs specifying the procedures for the write/read processings, in order to realize the method of writing/reading data as described in connection with FIGS. 3 to 6. Examples of the medium for recording programs include a floppy disk, hard disk, optical disk, magnet-optic disk, CD-ROM, magnetic tape, nonvolatile memory card, ROM and the like. The present invention further encompasses programs by which the computer executes the data write/read processing to realize the above-mentioned functions of the embodiments, and by which the above-mentioned functions of the embodiments are realized in cooperation with an OS (operating system) operating in the computer or in cooperation with any other application software. The invention further encompasses systems that realize the above-mentioned functions of the embodiments in a manner that, after a program that is supplied is stored in a memory in a function expansion board in the computer or in a function expansion unit connected to the computer, the CPU in the function expansion board or in the function expansion unit executes part or whole of the practical processings based upon the instructions of the program.

What is claimed is:

1. A method of producing nonvolatile semiconductor memory devices which store multi-bit digital data of at least 2 bits therein, the method comprising:

forming a multi-layer film suitably arranged for storage of the multi-bit digital data by successively depositing a first insulating film, a first dielectric film working as an electric charge accumulation layer, a second insulating film, a second dielectric film working as an electric charge accumulation layer, a third insulating film, a third dielectric film working as an electric charge accumulation layer, and a fourth insulating film on a predetermined region on a semiconductor substrate;

forming an electrically multi-layer film on said multi-layer film and forming a resist thereon in the shape of a gate electrode;

forming an electric charge-capturing film and a gate electrode in the shape of said resist by removing said multi-layer film and said electrically conducting layer by using said resist as a mask; and forming a source region and a drain region by adding impurities having a type of electric conduction opposite to that of said semiconductor substrate to a surface region of said semiconductor substrate by using said resist as a mask.

2. The method according to claim 1, wherein said forming said multi-layer film includes forming oxide films as said first to fourth insulating films, and forming nitride films as said first to third dielectric films.

3. The method according to claim 2, further comprising forming at least said second to fourth oxide films each at a first thickness, and forming said first to third nitride films each at a second thickness.

4. The method according to claim 3, further comprising maintaining said first to third nitride films at a thickness larger than a thickness of said second to fourth oxide films.

5. The method according to claim 2, further comprising forming said second to fourth oxide films at respective thicknesses that successively increase from a lower layer toward an upper layer.

6. The method according to claim 5, further comprising forming said first to third nitride films at respective thicknesses that successively increase from the lower layer toward the upper layer.

7. The method according to claim 1, wherein said forming said multi-layer film includes forming oxide films as said first to fourth insulating films, and forming polysilicon films as said first to third dielectric films.

8. The method according to claim 7, further comprising forming at least said second to fourth oxide films each at a first thickness, and forming said first to third polysilicon films each at a second thickness.

9. The method according to claim 8, further comprising forming said first to third polysilicon films at a thickness larger than a thickness of said second to fourth oxide films.

10. The method according to claim 7, further comprising forming said second to fourth oxide films are formed maintaining thicknesses that successively increases from the lower layer toward the upper layer.

11. The method according to claim 10, further comprising forming said first to third polysilicon films at respective thicknesses that successively increase from a lower layer toward an upper layer.

12. A method of producing nonvolatile semiconductor memory devices which store multi-bit digital data of at least 2 bits therein, the method comprising:

forming a trench in a recessed shape at a predetermined position on a semiconductor substrate;

forming a multi-layer film adapted for storage of the multi-bit digital data by successively depositing a first insulating film, a first dielectric film working as an electric charge accumulation layer, a second insulating film, a second dielectric film working as an electric charge accumulation layer, a third insulating firm, a third dielectric film working as an electric charge accumulation layer, and a fourth insulating film so as to cover the whole surface of said semiconductor substrate;

forming an electrically conducting layer so as to cover said multi-layer film;

forming an electric charge capturing film in an L-shape, and a gate electrode, spanning a side wall of said trench and a portion of the bottom in contact with said side wall by subjecting the whole region where said electrically conducting layer is formed to anisotropic dry etching; and forming a source region and a drain region by adding impurities, having a type of electric conduction opposite to that of said semiconductor substrate, to the surface region of said semiconductor substrate by masking only the region of said gate electrode.

* * * * *